(12) United States Patent
Zeile et al.

(10) Patent No.: US 8,969,835 B2
(45) Date of Patent: Mar. 3, 2015

(54) PARTICLE BEAM SYSTEM INCLUDING A SUPPLY OF PROCESS GAS TO A PROCESSING LOCATION

(71) Applicant: Carl Zeiss Microscopy GmbH, Jena (DE)

(72) Inventors: Ulrike Zeile, Heidenheim (DE); Matthias Knappich, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/746,560

(22) Filed: Jan. 22, 2013

(65) Prior Publication Data

US 2013/0187064 A1 Jul. 25, 2013

(30) Foreign Application Priority Data

Jan. 23, 2012 (DE) .......................... 10 2012 001 267

(51) Int. Cl.
| | | |
|---|---|---|
| *G21G 1/00* | (2006.01) | |
| *F17D 1/04* | (2006.01) | |
| *H01J 37/02* | (2006.01) | |
| *H01J 37/305* | (2006.01) | |

(52) U.S. Cl.
CPC . *F17D 1/04* (2013.01); *H01J 37/02* (2013.01); *H01J 37/3056* (2013.01); *H01J 2237/006* (2013.01)
USPC ..................................... 250/492.1; 250/492.2

(58) Field of Classification Search
None
See application file for complete search history.

(56) References Cited

U.S. PATENT DOCUMENTS

| 6,106,890 | A  | * | 8/2000 | Hayashi ...................... 427/96.7 |
| 6,157,662 | A  | * | 12/2000 | Scaggs et al. .................. 372/60 |
| 6,235,118 | B1 | * | 5/2001 | Hayashi ........................ 118/708 |
| 7,482,603 | B2 |   | 1/2009 | Tomimatsu et al. |
| 8,278,224 | B1 | * | 10/2012 | Mui et al. ...................... 438/778 |
| 2004/0173759 | A1 | * | 9/2004 | Koops et al. .................. 250/428 |

(Continued)

FOREIGN PATENT DOCUMENTS

| DE | 10042098 | 3/2002 |
| DE | 10208043 | 9/2003 |

(Continued)

OTHER PUBLICATIONS

H. Wanzenböck et al., "Reliability of Silicon Oxide deposited by an Focused Ion Beam as Insulator for Microelectronic Interconnect Layer", Meeting of the Electrochemical Society (ECS), Washington D. C., USA; Mar. 25-30, 2001.

(Continued)

*Primary Examiner* — Andrew Smyth
(74) *Attorney, Agent, or Firm* — Fish & Richardson P.C.

(57) ABSTRACT

A system for supplying a process gas to a processing location of a particle beam system is disclosed. The system for supplying the processing gas includes a gas reservoir, a gas conduit, a pipe located close to the processing location, a valve between the gas conduit and the pipe, and a controller configured to open and to close the valve to switch the system from a first mode of operation in which process gas is not supplied to the processing location to a second mode of operation in which process gas is supplied to the processing location. The controller can alternately open and close the valve in cycles. Each cycle can include a first duration in which the valve is open and a second duration in which the valve is closed. The ratio of the first duration to the second duration can be changed.

22 Claims, 4 Drawing Sheets

(56) References Cited

U.S. PATENT DOCUMENTS

| | | | |
|---|---|---|---|
| 2006/0284090 A1* | 12/2006 | Koops et al. | 250/310 |
| 2007/0187622 A1* | 8/2007 | Nagano | 250/492.21 |
| 2008/0078745 A1* | 4/2008 | Cordell et al. | 216/67 |
| 2008/0220379 A1* | 9/2008 | Nomura | 430/322 |
| 2009/0223451 A1* | 9/2009 | Kruger et al. | 118/723 VE |
| 2010/0068408 A1 | 3/2010 | Zaykova-Feldman et al. | |
| 2010/0282596 A1 | 11/2010 | Auth et al. | |
| 2011/0114665 A1 | 5/2011 | Chandler et al. | |
| 2011/0183523 A1 | 7/2011 | Auth et al. | |
| 2012/0161405 A1* | 6/2012 | Mohn et al. | 279/142 |

FOREIGN PATENT DOCUMENTS

| | | | |
|---|---|---|---|
| DE | 102008 037951 | 2/2010 | |
| EP | 2061068 | 5/2009 | |
| EP | 1204133 | 3/2011 | |
| JP | 02248390 A * | 10/1990 | C30B 23/08 |
| WO | 2006/025968 | 3/2006 | |
| WO | 2009/080707 | 7/2009 | |
| WO | 2010/017963 | 2/2010 | |

OTHER PUBLICATIONS

H. Wanzenböck et al., "Multiple-Gas-Injector for Electron Beam Induced Deposition", Poster: 2nt International FEBIP Workshop 2008—Workshop on focused electron beam induced Processing, Thun, Schweiz; 07.07.2008-08.07.2008.

H. Wanzenböck et al., "Focused Electron beam induced deposition of Silicon Oxide", Meeting of the Electrochemical Society (ECS), 208th ECS Meeting, Abstract #730, copyright ECS, Los Angeles, California, USA, Oct. 16-21, 2005.

T. Liang et al., "Demonstration of Damage-Free Mask Repair Using Electron Beam-induced Processes", Proceedings of SPIE, vol. 5446, 2004, pp. 291-300.

Office Action in German patent application No. 10 2012 001 267.5, with English translation, dated Oct. 17, 2012.

* cited by examiner

PARTICLE BEAM SYSTEM INCLUDING A SUPPLY OF PROCESS GAS TO A PROCESSING LOCATION

CROSS-REFERENCE TO RELATED APPLICATION

This application claims priority under 35 USC 119 to German Patent Application No. 10 2012 001 267.5, filed Jan. 23, 2012, the entire contents of which are incorporated by reference herein.

FIELD

The disclosure relates to systems in which a particle beam and a process gas are supplied to an object in order to process the object.

BACKGROUND

Particle beam systems are used to process and modify miniaturized objects by depositing material on the object or removing material from the object. A process gas including a precursor of a material to be deposited can be supplied to a processing location on the object, and the precursor can be activated by the particle beam such that the material is deposited at the processing location or a region surrounding the processing location. Alternatively, a suitable process gas can be supplied to the processing location on the object, and the process gas can activated by the particle beam such that the process gas forms compounds with the material of the object which are released from the object and can be removed subsequently.

An example of such system is known from US 2006/0284090 A1.

SUMMARY

The disclosure provides a particle beam system which supplies one or more different process gases to a processing location and has an improved configuration and/or allows more precise control of the supplied process gases.

According to embodiments, a system for supplying a process gas to a processing location includes at least one gas reservoir, at least one gas conduit having a first end connected to the at least one gas reservoir, a pipe having a first end located close to the processing location and a valve provided between a second end of the at least one gas conduit and a second end of the pipe. The valve is configured to selectively allow and prevent a gas flow from the at least one gas reservoir to the processing location via the at least one gas conduit and the pipe. Herein, a gas reservoir is any apparatus storing a material providing a gaseous substance which can leave the reservoir. The material in the gas reservoir can be in a gaseous state, a liquid state or a solid state, or it may include mixtures of a gaseous, liquid or solid state. The gas reservoir may include, for example, a gas bottle in which the material is stored as a compressed gas or a liquid, or it may include a container storing the material in a solid state which releases the gas by sublimation.

According to some embodiments, the system for supplying a process gas to a processing location includes a controller configured to open and to close a valve provided in a gas supply path between a gas reservoir and the processing location, to switch the system from a first mode of operation in which process gas is not supplied to the processing location to a second mode of operation in which process gas is supplied to the processing location and to alternately open and close the valve in plural cycles at a beginning of the second mode of operation, wherein each cycle includes a first duration in which the valve is open, and a second duration immediately subsequent to the first duration in which the valve is closed.

According to exemplary embodiments herein, the following relation is fulfilled for at least one pair of subsequent cycles: a ratio of the first duration to the second duration in a first cycle of the pair is smaller than the ratio of the first duration to the second duration in a second cycle of the pair subsequent to the first cycle.

According to further exemplary embodiments, the relation is fulfilled for more than 5 pairs (more than 10 pairs, more than 50 pairs, or more than 100 pairs) of subsequent cycles.

Herein, it is not required that the subsequent cycles forming the pair are temporally immediately adjacent to each other, such that one or more cycles in which the valve is opened and closed can be provided between the two subsequent cycles of the pair.

According to particular embodiments, the above relation is fulfilled for one pair (more than two pairs, more than three pairs, more than five pairs or more than ten pairs) of immediately subsequent cycles.

According to further exemplary embodiments, the first mode of operation has a duration of more than 1 second (plural seconds, or more than 10 seconds), and/or the second mode of operation has a duration of more than 0.1 second (more than 1 second, or more). The system is switched to the first mode of operation if process gas is not to be supplied to the processing location. It is then possible that the particle beam is not directed to the processing location or that the particle beam is switched off in order to not modify the object at all. If plural different process gases are used, the system can be in the first mode of operation with respect to a selected one of the plural process gases in order to not supply the selected process gas to the processing location such that a processing using the selected process gas is not performed. The particle beam can be switched on and directed to the processing location, wherein the selected process gas is not to be activated by the particle beam such that a deposition of material at the processing location or a removal of material from the processing location using the selected process gas is avoided. However, some other process gas which is different from the selected process gas can be supplied to the processing location in order deposit material at the processing location or to remove material from the processing location using this other process gas.

The second mode of operation is intended to supply process gas to the processing location such that the process gas is activated by the particle beam in order to deposit material at the processing location or remove material from the processing location. While process gas is supplied to the processing location in the second mode of operation, it is possible that the valve provided in the gas supply path between the reservoir and the processing location is closed for a short period of time. The valve is located at a certain distance away from the processing location and modifies the gas flow at a location which is remote from the processing location, accordingly. Processes balancing pressure differences of the gas within the pipe and between the first end of the pipe and the processing location and diffusion processes of the gas within the pipe result in that sudden interruptions of the gas flow caused by the closing of the valve do not result in equally sudden interruptions of the gas flow towards the processing location. Therefore, periodic opening and closing of the valve in the second mode of operation may still result in a continuous or quasi-continuous supply of process gas to the processing location. Under such operation, an amount of process gas supplied to the processing location per time can be adjusted to a desired value by adjusting the ratio of the first duration during which the valve is open and the second duration during which the valve is closed.

Moreover, the gas flow does not only depend on the ratio of the first duration to the second duration, which ratio can also be referred to as a duty cycle. The gas flow does also depend on the gas pressure of the gas provided in the volume of the gas conduit immediately upstream of the valve. The inventors have found that, in some situations, the gas pressure in the gas conduit immediately upstream of the valve is relatively high at ends of the first mode of operation in which gas is not supplied to the processing location during a longer period of time. However, at the beginning of the second mode of operation and during the second mode of operation, the gas pressure immediately upstream of the valve decreases continuously. If the second mode of operation is controlled such that the ratio between the first duration and the second duration is maintained at a predetermined constant value in order to provide a desired gas flow to the processing location, this results in practice in a continuous decrease of the gas flow supplied to the processing location during the second mode of operation since the gas pressure immediately upstream of the valve decreases.

This is the reason why the first and second durations of subsequent cycles are varied in the embodiment illustrated above such that the ratio of the first duration to the second duration increases with time in order to maintain a substantially constant flow of gas to the processing location during the second mode of operation. There exist one or more pairs of cycles among the plurality of subsequent cycles for which the above mentioned relation is fulfilled. The relation defines an increase in time of the duty cycle at the beginning and during the second mode of operation. It is, however, not required that the duty cycle is strictly monotonically increasing. It is possible that the duty cycle is maintained constant during plural immediately subsequent cycles or that the duty cycle is even reduced for a short period of time. Only particular embodiments use duty cycles which are strictly monotonically increasing at the beginning and during the second mode of operation.

According to exemplary embodiments, a system for supplying a process gas to a processing location includes plural gas reservoirs, plural gas conduits, wherein each gas conduit has a first end connected to a respective gas reservoir, a single pipe having a first end close to the processing location, and plural valves, wherein each valve is provided between a second end of one of the gas conduits and a second end of the pipe. It is possible to supply a desired process gas stored in one of the plural reservoirs via the pipe to the processing location by opening a selected valve. If only one of the plural valves is open and the remaining valves are closed, only one process gas is supplied to the processing location via the pipe, accordingly. It is, however, also possible to simultaneously open two or more of the plural valves in order to supply two or more process gases via the pipe to the processing location, such that a mixture of plural process gases is supplied to the processing locations.

According to exemplary embodiments, a system for supplying of plural process gases to a processing location includes a controller configured to open and to close first and second valves in cycles, wherein each cycle includes a first duration in which the first valve is open and the second valve is closed, and a second duration in which the first valve is closed and the second valve is open. The controller is further configured to change a ratio between the first duration and the second duration in order to adjust a mixture ratio of the gas mixture supplied to the processing location. The two valves are controlled such that they are not simultaneously open such that the gas flow through the valves occurs in an alternating manner. This results in that a mixing of the two different gases is avoided or at least significantly reduced in the gas volume downstream of the valves, within portions of the pipe or within the full volume of the pipe. Still, a mixture of the two gases is supplied to the processing location, wherein a mixture ratio of the supplied gases is controlled by the first and second durations. By providing such alternating supply of different process gases, it is possible to deposit a mixture of materials at the processing location by activating the supplied gases with the particle beam. The deposited materials are formed from the precursors supplied as the process gases, and the deposition of the mixture of materials may occur continuously or quasi-continuously since the deposition processes are slow as compared to the first and second durations.

The inventors have found that some process gases which flow simultaneously through the gas volume downstream of the valves and through the pipe may react with each other and result in undesired depositions of material within the pipe, for example. Such deposition of materials within the pipe resulting from a mixture of gases within the pipe can be significantly reduced by the alternating control of the valves according to cycles illustrated above such that the gases flow through the gas volume downstream of the valves and the pipe in an alternating manner.

According to exemplary embodiments herein, each cycle may include at least one third duration in which both valves are closed. This results in a further temporal and local separation of the gases flowing through the pipe such that depositions caused by a reaction of the two gases with each other within the pipe are further reduced, wherein the deposition of a mixture of materials at the processing location is still not negatively affected.

According to further embodiments, the two or more valves are alternately controlled, and the duty cycle of each valve is increased at the beginning or during the second mode of operation in order to provide a constant flow of each single gas towards the processing location as illustrated above with reference to the control of a single valve. Herein, it is in particular possible to provide different rates of change of the duty cycle for the different gases at the beginning of the second mode of operation.

According to exemplary embodiments, a system for supplying a process gas to a processing location includes a vacuum enclosure containing the processing location, a vacuum pump for evacuating the vacuum enclosure, a pressure sensor configured to generate a pressure signal indicative of a gas pressure within the vacuum enclosure, at least one gas reservoir, at least one valve provided in a gas flow path between the gas reservoir and the processing location, and a controller. The controller can be configured to open and to close the valve and to switch the system from a first mode of operation in which process gas is not supplied to the processing location to a second mode of operation in which process gas is supplied to the processing location. The controller can be further configured to open and to close the valve in cycles in the second mode of operation, wherein each cycle includes a first duration in which the valve is open and a second duration immediately subsequent to the first duration in which the valve is closed. The controller can be configured to adjust a ratio between the first duration and the second duration based on the pressure signal.

As already illustrated above, the amount of the gas flow supplied to the processing location does not only depend on the ratio of the first duration and the second duration, i.e. the duty cycle of the controlled valve, but also on other factors, such as a gas pressure within the gas volume upstream of the valve, the type of the supplied gas and possibly other unknown factors. In practice, it is, however, desirable to provide a constant gas flow towards the processing location, wherein the desired constant gas flow has been found to be advantageous in preceding experiments. However, it is possible that the preceding experiments have been performed under conditions which were different with respect to the gas pressure upstream of the valve and other factors such that it is difficult to adjust the duty cycle of the valve only based on previous experiments. The inventors have found that desired advantageous results can be often achieved if the duty cycle is controlled based on the gas pressure within the vacuum enclosure as measured by the pressure sensor, even when subsequent experiments differ with respect to gas pressures within the reservoir and upstream of the valves and possibly other factors. Accordingly, it is possible to perform experiments using different amounts of gas flow towards the processing location by varying the duty cycle of the valve in order to determine an adjustment of the duty cycle and a corresponding resulting pressure signal at which advantageous results with respect to a deposition of material on the object or removal of material from the object are achieved. The resulting pressure signal is then used in subsequent processings in order to repeat the desired results wherein the controlling is based on the pressure signals, possibly resulting in different duty cycles in different processings.

According to some exemplary embodiments, a system for supplying a process gas to a processing location includes plural gas reservoirs storing different process gases and plural valves, wherein each valve is associated with one of the gas reservoirs. A controller includes plural memories, wherein each memory is associated with one of the reservoirs and stores a value representing a pressure signal used by the controller in order to adjust the duty cycle for the gas stored in a particular reservoir. The inventors have found that different gases may cause different pressure signals even when the different gases are provided at same absolute pressures within the vacuum enclosures, since the sensitivity of the gas sensor can be different for different types of gases. Therefore, it is advantageous to provide different values of the pressure signal for the different gases wherein the different values are used by the controller to control the duty cycle of the gas supply for the different gases.

According to some further exemplary embodiments, a system for supplying a process gas to a processing location of a particle beam system includes a pipe having a first end located close to the processing location; a first gas reservoir; a first gas conduit having a first end connected to the first gas reservoir; a first valve provided between a second end of the first gas conduit and a second end of the pipe, wherein the first valve is configured to selectively allow and prevent a gas flow from the first gas reservoir to the processing location via the first gas conduit and the pipe; at least one second gas reservoir; at least one second gas conduit having a first end connected to the at least one second gas reservoir; at least one second valve provided between a second end of the at least one second gas conduit and a second end of the pipe, wherein the at least one second valve is configured to selectively allow and prevent a gas flow from the at least one second gas reservoir to the processing location via the at least one second gas conduit and the pipe; and a heater configured to commonly heat the first gas conduit and the at least one second gas conduit; wherein the first gas reservoir contains one of a fluorine gas and a chlorine gas, and wherein the at least one second gas reservoir contains a gas which is free of fluorine and chlorine and which includes at least one of $SiO_2$, $O_2$, $N_2$ and $H_2O$ or which includes at least one compound including one of Pt, W, Au, J and C.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
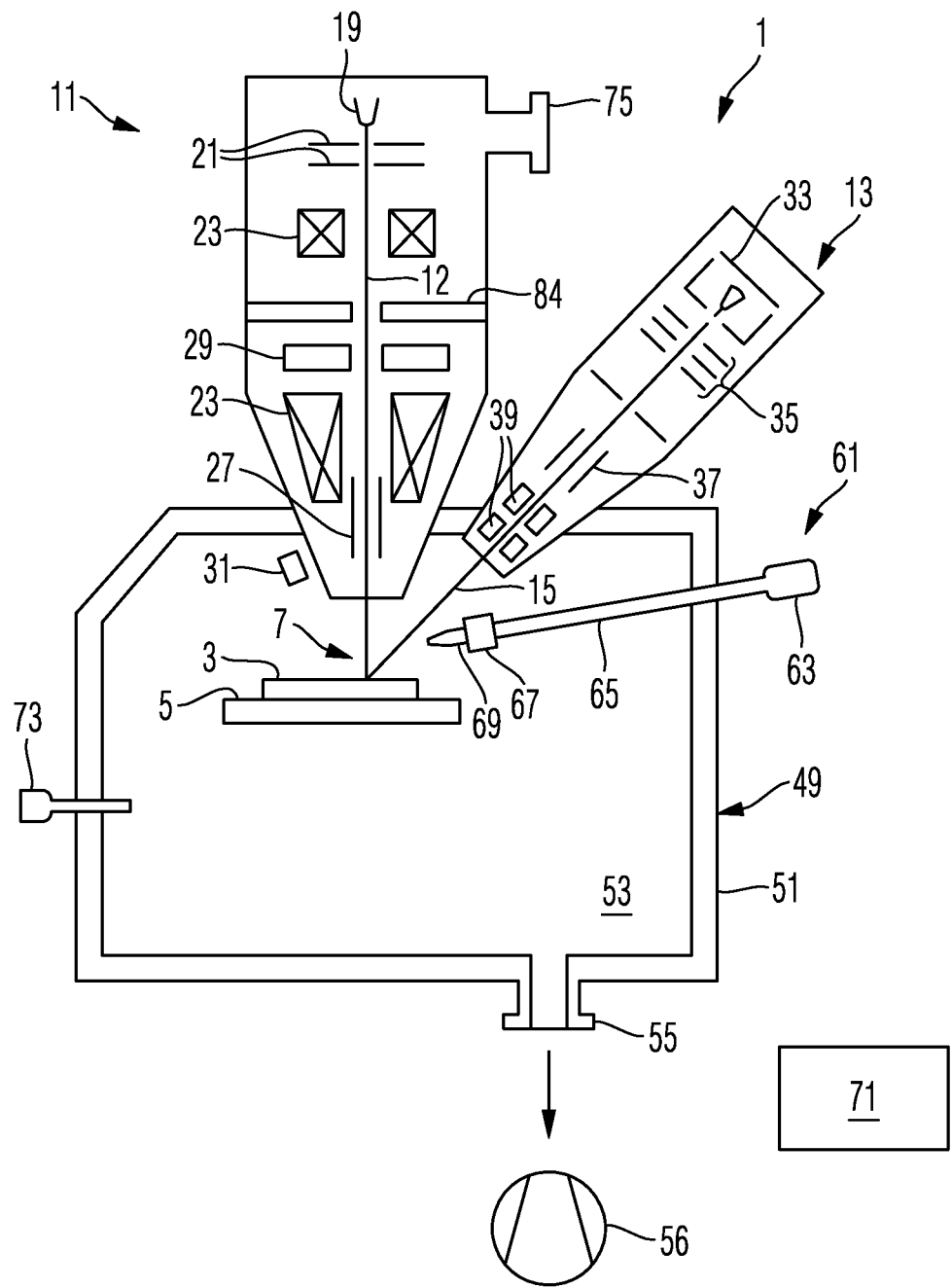
FIG. 1 shows a schematic illustration of a particle beam system.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematic illustration of a system for supplying at least one particle beam and at least one process gas to a processing location. The system 1 can be used for processing an object 3 mounted on an object mount 5 such that a region of the object 3 which is to be processed is located at or close to a processing location 7 of the system 1. The processing system 1 of the illustrated embodiment includes two particle beam columns 11 and 13, wherein each particle beam column 11, 13 generates a particle beam 12 and 15, respectively, wherein both particle beams 12, 15 can be directed to the processing location 7. In the illustrated embodiment, the particle beam column 11 is an electron beam column wherein the generated particle beam 12 is an electron beam, and the particle beam column 13 is an ion beam column, wherein the particle beam 15 is an ion beam.

The object mount 5 can be configured such that it can displace the object relative to the processing location 7 in three different directions in order to be able to process plural different selectable regions on the surface of the object 3 with the particle beams 12 and 15. Further, the object mount 5 can be configured to change an orientation of the object 3 relative to the particle beams 12 and 15.

The electron beam column 11 includes an electron source 19 having electrodes 21 for extracting an electron beam from a cathode of the electron source and to accelerate the electrons of the beam. The electron beam column 11 further includes a condenser lens system 23 for shaping an electron beam 12, and an objective lens 25 for focusing the electron beam 12 at the processing location 7. Beam deflectors 27 are provided to change a location of incidence of the electron beam 12 on the object 3, such that the beam can be scanned across the object surface, wherein a detector 29 located within the electron beam column or a detector 31 located adjacent to the electron beam column 11 can be used to detect particles released from the object, such as secondary electrons and backscattered electrons. Detection signals of the detector 29, 31 can be used to generate an electron microscopic image of the region of the object scanned with the electron beam.

The ion beam column 13 includes an ion source 33 and electrodes 35 for shaping and accelerating the ion beam 15. Beam deflectors 37 and focusing coils or focusing electrodes 39 are used to focus the ion beam 15 on the processing location 7 and to scan the ion beam across the object 3.

The system 1 further includes a vacuum enclosure 49 having an enclosure wall 51 surrounding the processing location 7 such that the processing location 7 is located within a vacuum volume 53. A vacuum pump 56 is connected to the vacuum enclosure 49 via a pump port 55 in order to evacuate the vacuum volume 53. Front ends of the particle beam columns 11, 13 project into the vacuum volume 53 and are sealed relative to the enclosure wall 51. The particle beam columns 11 and 13 may have additional pump ports 75 for evacuating an interior of the beam columns, wherein the additional ports 75 can be connected to vacuum pump 56 or additional vacuum pumps.

The system 1 further includes a gas supply system 61 for supplying at least one process gas to the processing location 7. FIG. 1 schematically shows a gas reservoir 63 located outside of the vacuum enclosure 49, a gas conduit 65 traversing the wall 51 of the vacuum enclosure 49, a valve 67 and a pipe 69 having an end positioned close to the processing location 7.

According to alternative examples, the gas reservoir 63 can be located within the vacuum enclosure 49 such that the gas conduit 65 does not traverse the wall 51 of the vacuum enclosure 49 and corresponding vacuum seals can be avoided.

Moreover, the gas supply system 61 may include a positioning system (not shown in FIG. 1) configured to position the end of the pipe 69 relative to the processing location 7. For this purpose, it is possible to displace the whole gas supply system 61 relative to the processing location, or it is only a portion of the gas supply system, such as the pipe 69, which is displaced relative to the processing location, wherein the portion, such as the pipe, is connected to remaining portions of the gas supply system via flexible conduits.

The valve 67 is controlled by a controller 71 in order to allow a process gas stored in the reservoir 63 to flow towards the processing location 7. At the processing location 7, the process gas can be activated by the ion beam 15 or the electron beam 12 in order to achieve a deposition of material on the object at the processing location 7 or a region close to the processing location, or to remove material from the object 3. The controller 7 may further control the beam deflectors 27 and 37 in order to direct the particle beams 12 and 15, respectively, to selectable different locations on the surface of the object 3 in order to change the location where the deposition of material or the removal of material occurs due to the activation of the supplied process gas with the particle beams.

The system 1 further includes a vacuum sensor 73 for detecting the gas pressure in the vacuum volume 53 and supplying a pressure signal to the controller 71, wherein the pressure signal is indicative of the gas pressure within the vacuum volume 53.

Figure 2:
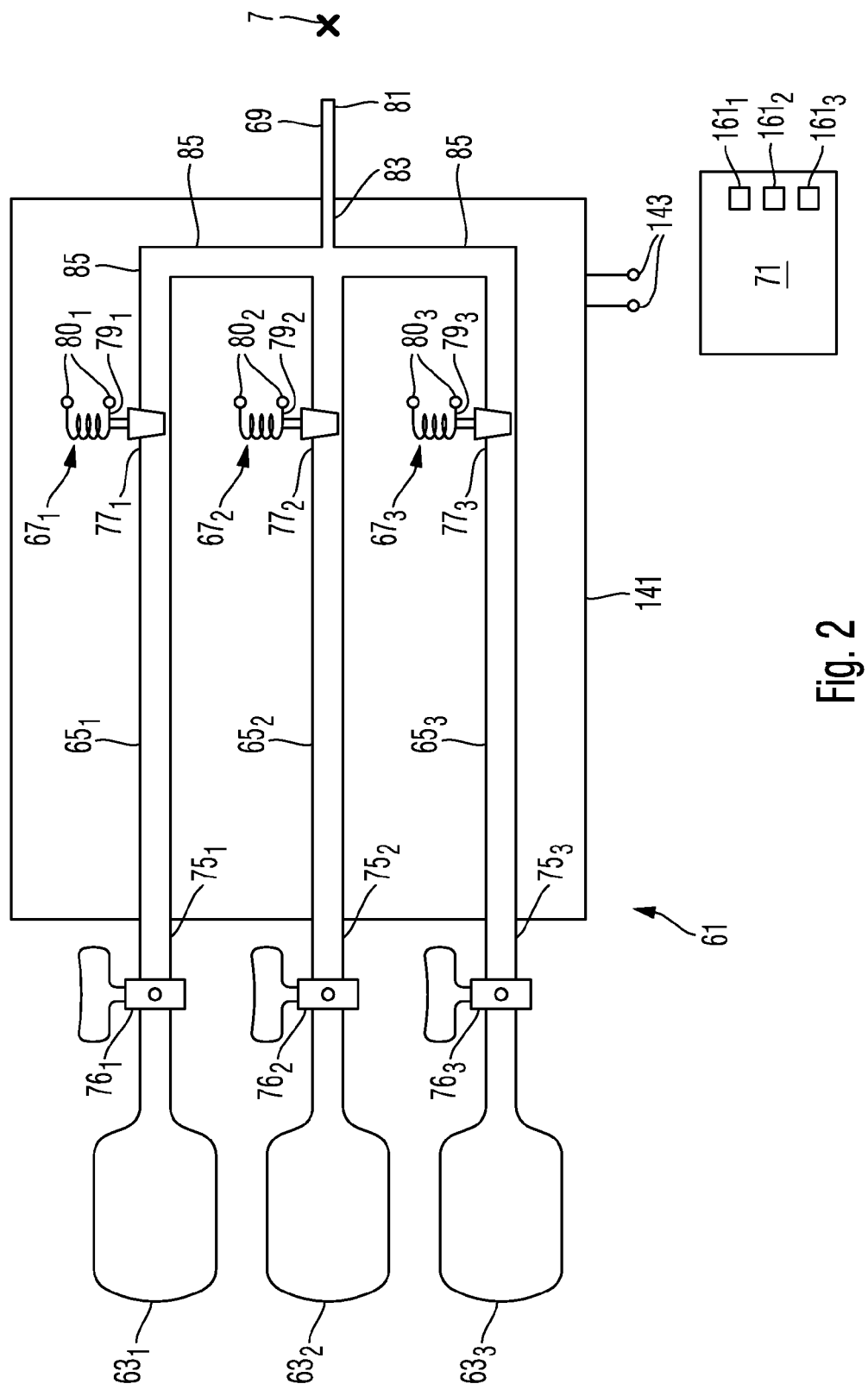
FIG. 2 is a schematic illustration of a system for supplying process gases to a processing location.

FIG. 2 is a schematic representation illustrating some details of the gas supply system 61. The gas supply system 61 includes three gas reservoirs $63_1$, $63_2$, $63_3$ storing inventories of three different process gases. First ends $75_1$, $75_2$, $75_3$ of gas conduits $65_1$, $65_2$, $65_3$ are connected to the reservoirs $63_1$, $63_2$, $63_3$. Each of the reservoirs may include it's own block valve, or a respective block valve $76_1$, $76_2$, $76_3$ can be provided between the reservoirs $63_1$, $63_2$, $63_3$ and first ends $75_1$, $75_2$, $75_3$ of the gas conduits $65_1$, $65_2$, $65_3$. The block valves can be operated by hand, or they can be opened by the controller 71 in order to start up the operation of the gas supply system 61, and they can be closed in order to stop the operation of the gas supply system 61.

Valves $67_1$, $67_2$, $67_3$ are connected to second ends $77_1$, $77_2$, $77_3$ of the gas conduits $65_1$, $65_2$, $65_3$ opposite to the first ends $75_1$, $75_2$, $75_3$. The valves $67_1$, $67_2$, $67_3$ are configured to selectively allow and prevent a flow of gas through the ends $77_1$, $77_2$, $77_3$ of the gas conduits $65_1$, $65_2$, $65_3$ and through the respective valves $67_1$, $67_2$, $67_3$. In the illustrated example, the valves $67_1$, $67_2$, $67_3$ are magnet valves, each including a coil magnet $79_1$, $79_2$, $79_3$ having terminals $80_1$, $80_2$, $80_3$ connected to the controller 71 such that the controller 71 may supply activation currents to the coils 79 in order to selectively open and close the valves.

The pipe 69 has a first end 81 located close to the processing location 7, and a second end 83 connected to a manifold 65 connected to the valves $67_1$, $67_2$, $67_3$.

Figure 3:
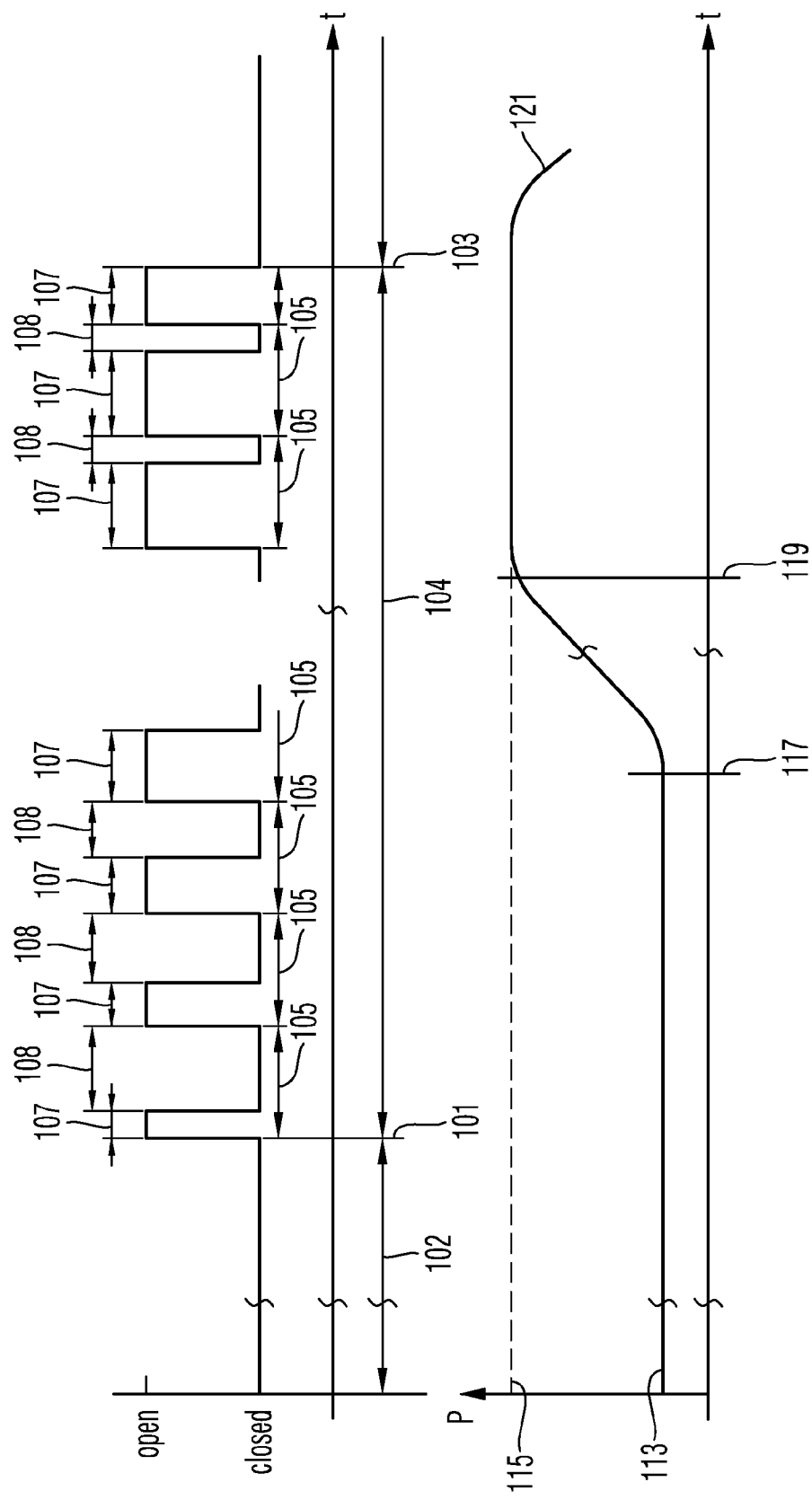
FIG. 3 shows graphs illustrating the control of a valve of the system shown in FIG. 2.

The upper portion of FIG. 3 shows a graph illustrating a control of one of the valves $67_1$, $67_2$, $67_3$ by the controller 71 in dependence of time t. In particular, the graph illustrates switching of the system 1 from a first mode of operation to a second mode of operation at a time 101 and from the second mode of operation back to the first mode of operation at a time 103. The first mode of operation in which the system is set before time 101 has a duration 102 which may amount to more than 1 second, plural seconds or even hours. The second mode of operation in which the system is between times 101 and 103 has a duration 104 which may amount to more than 0.1 seconds, more than 1 second or even plural minutes. In the first mode of operation, process gas is not supplied to the processing location such that the valve is in the closed position indicated by "closed" in FIG. 3. In the second mode of operation 104, process gas is supplied to the processing location, and the valve is temporally in the open position, indicated by "open", in FIG. 3 during the period 104.

The valve is alternately opened and closed in cycles during the second mode of operation 104. The cycles have a duration 105. In the illustrated example, all cycles have a same duration 105. It is, however, also possible that different cycles have different durations.

In each cycle, the valve is open during a period 107 and closed during a period 108. A ratio of the first duration 107 in which the valve is open and the second duration 108 in which the valve is closed can be determined for each cycle 105. Such ratio can also be referred to as a duty cycle.

At the beginning of the second mode of operation, i.e. subsequent to time 101, the duty cycle is increased cycle by cycle until it reaches a stationary value in order to maintain a constant flow of process gas towards the processing location in the second mode of operation. According to some examples, the value of the ratio or duty cycle at the beginning of the second mode of operation can be smaller than 0.2, 0.4 or 0.6 times the stationary value used to supply process gas for a longer period of time. The time in which the duty cycle is increased at the beginning of the second mode of operation may amount to 0.5 seconds, 1 second, 2 seconds or 5 seconds, for example. The duty cycle can be regarded as stationary if its value does not change by more than 10% within a period of 2 seconds or more than 5 seconds, for example. The duration of the cycles 105 can be short, such that more than 5 cycles, more than 10 cycles or more than 20 cycles are performed at the beginning of the second mode of operation until the duty cycle reaches its stationary value. The duration of one cycle 105 can be shorter than 1 second, shorter than 0.5 seconds or shorter than 0.1 seconds, for example.

It is generally desirable to supply the process gas to the processing location at a constant flow, i.e. a constant amount of gas per unit time, in the second mode of operation in which a processing of the object is performed at the processing location by deposition of material provided by a precursor of the process gas or by removing material from the object using the process gas. It might appear desirable to use a duty cycle suitable for supplying process gas at a desirable flow for a longer period of time already at the beginning of the second mode of operation. However, some properties of the gas reservoirs and of the gas conduit connecting the gas reservoir with the valve will change with time when the system is in the second mode of operation. In particular, the gas pressure within the reservoir and within the gas conduit immediately upstream of the valve is greater immediately at the beginning of the second mode of operation than at later times at which the process gas is supplied to the processing location using a constant duty cycle. For example, the gas may be generated by sublimation from a solid state material within the gas reservoir at a limited rate. If the first mode of operation in which process gas is not supplied to the processing location has a significant duration, a substantial amount of process gas may accumulate within the reservoir and the gas conduit, resulting in an increased gas pressure which will be reduced as soon as the valve is opened and gas can escape from the reservoir and the gas conduit through the pipe towards the processing location. Moreover, the gas conduit provides a resistance against the gas flow such that the gas pressure at the valve 67 is lower when a gas flow through the gas conduit 65 occurs during the second mode of operation as compared to the gas pressure at the valve at the end of the first mode of operation where a gas flow does not occur.

In the illustrated example, four cycles 105 are shown at the beginning of the second mode of operation at time 101. The ratio between periods 107 and 108 is continuously increased in these four cycles. The number of four cycles is used for illustrative purposes only and a higher number of cycles in which the ratio is increased can be used in practice. Moreover, the increase of the ratio does not necessarily occur continuously, i.e. strictly monotonically. It is possible that the ratio is increased step by step wherein the ratio is maintained constant between steps. It is further possible to reduce the ratio during a short period of time.

In addition to the control of the ratio between the periods 107 and 108 at the beginning of the second mode of operation 104 as illustrated above, it is possible to perform a further control of this ratio as illustrated in more detail below. Such additional control is advantageous for adjusting the gas flow towards the processing location to a desired value. This could be achieved, for example, by adjusting the ratio between durations 107 and 108, i.e. the duty cycle, to a value which has been proven advantageous in the past.

However, in the illustrated example, the duty cycle is changed with time such that the vacuum sensor 73 generates a predetermined pressure signal. The time dependence of the amount of the pressure signal P is shown in the lower portion of FIG. 3. In the first mode of operation 102 in which process gas is not supplied to the processing location for a longer period of time, there is a high vacuum in the vacuum volume 53 determined by the throughput of the vacuum pump 56 and a leakage rate of the vacuum enclosure 51. The pressure signal P generated by the pressure sensor 73 is at a low value 113 in the first mode of operation 102. Immediately subsequent to time 101 at which the system is switched from the first mode of operation to the second mode of operation, the pressure value P will still be at the low value 113 since the process gas supplied into the processing location has not yet reached the pressure sensor. An increase of the pressure value P can be detected subsequent to a later time 117. The controller starts to adjust the ratio between the durations 107 and 108, i.e. the duty cycle of the valve 67, based on the pressure signal P at an even later time 119. Subsequent to time 119, the duty cycle is controlled such that the pressure signal P assumes a predetermined value 115 which has been proven advantageous in preceding experiments, for example.

When the valve is closed at the end of the second mode of operation at time 103, the pressure signal P will decrease with a certain delay as indicated by a portion 121 of the graph. FIG. 3 also shows that the duration of the last cycle in the second mode of operation is shorter than the duration of the penultimate cycle 105 since the valve is closed at time 103 when the system is switched from the second mode of operation back to the first mode of operation.

The controlling of a valve as illustrated with reference to FIG. 3 above can be applied to each of the valves $67_1, 67_2, 67_3$ shown in FIG. 2. Herein, it is possible to use different predetermined values 115 for different process gases, wherein the different values 115 can be stored in data memories $161_1, 161_2, 161_3$ within the controller 71. Moreover, the number of three gas reservoirs, gas conduits and valves is an exemplary number used for illustrative purposes. The controlling of the valve illustrated with reference to FIG. 3 can be also applied to gas supply systems having one or two gas reservoirs or four and more gas reservoirs. Moreover, the controlling of the valve illustrated with reference to FIG. 3 above can be applied to valves of two or more gas supply systems which are configured separate from each other and wherein each gas supply system has its own pipe provided between a valve and the processing location.

Figure 4:
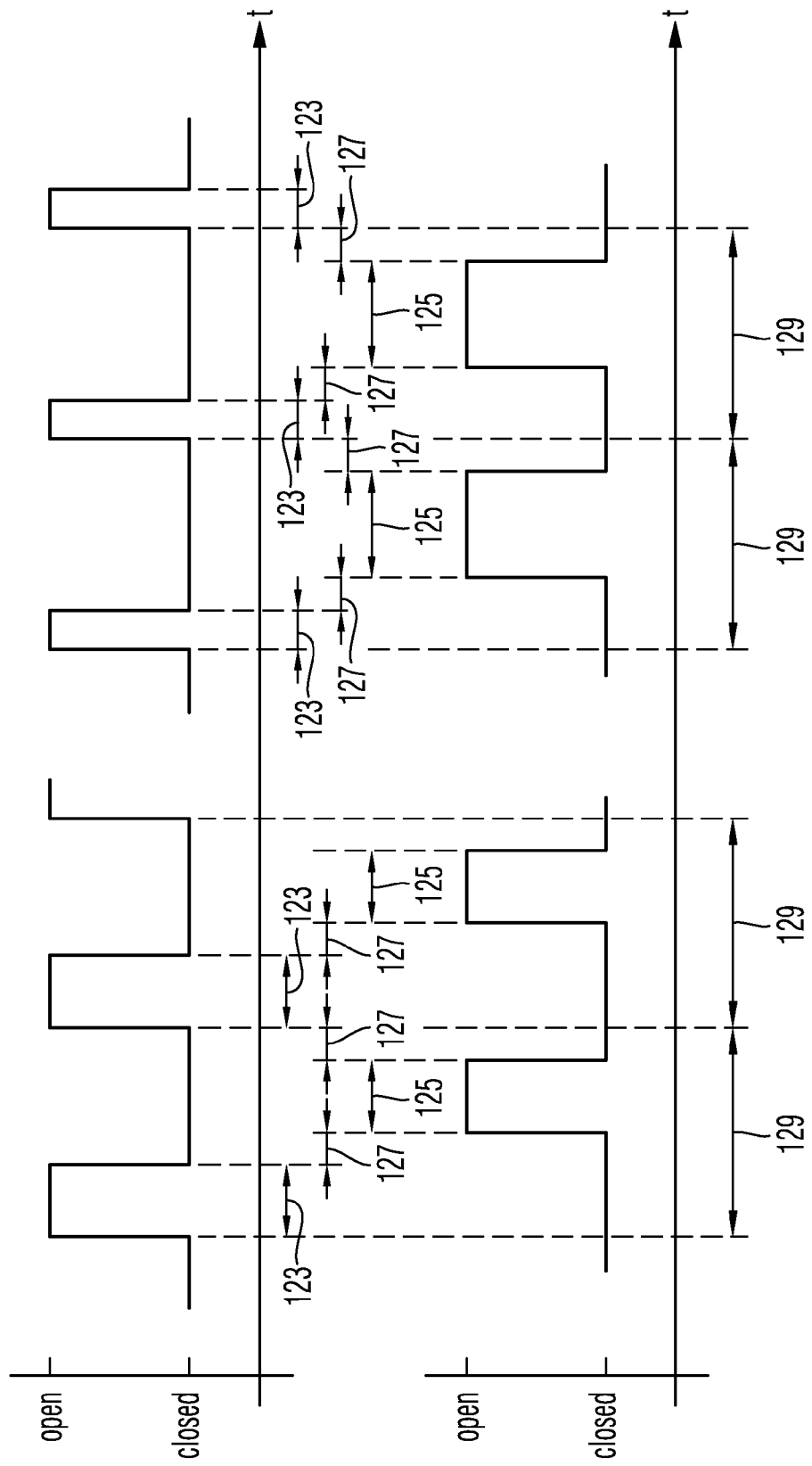
FIG. 4 shows two graphs illustrating the control of two valves in the system shown in FIG. 2.

FIG. 4 illustrates a method of controlling two different valves using the controller 71 in order to supply a mixture of two process gases to the processing location 7. The controlling of a first valve in dependence of time is shown in the upper portion of FIG. 4, and the controlling of a second valve in dependence of time is shown in the lower portion of FIG. 4, wherein "open" indicates the open position of the respective valve and "closed" indicates the closed position of the respective valve.

The controlling is performed according to cycles 129, wherein each cycle 129 includes a first portion having a duration 123 in which the first valve is open and the second valve is closed, a second portion of a duration 125 in which the first valve is closed and the second valve is open, and two third portions having a duration 127 in which both valves are closed. The two valves are alternately opened and closed, accordingly.

FIG. 4 shows two different settings of a ratio obtained by dividing the duration 123 by the duration 125 in the left and right portions, respectively. In the left portion of FIG. 4 this ratio is greater than in the right portion of FIG. 4. The ratio of the durations 123 and 125 determines the mixture ratio of the process gases supplied to the processing location via the two valves. A desired mixture ratio of the process gases can be adjusted by changing the ratio of the periods 123 and 125 as shown above. Moreover, the alternating control of the valves has an advantage in that the two process gases do not mix or do not substantially mix in the manifold 85 and the pipe 69 such that gas depositions resulting from a direct contact between different gases can be avoided or reduced within the manifold 85 and pipe 69. A mixing of different gases already in the manifold 85 and pipe 69 can be further reduced by increasing the duration of the periods 127 which temporally separate the periods 123 and 125 from each other and in which both valves are closed. However, the durations 127 can be very short or even zero if depositions due to different gases getting into contact within manifold 85 and pipe 69 do not present a serious problem.

It has been illustrated above with reference to FIG. 3 that both the duration of the cycles 129 and the duty cycle of the cycles 129 can be changed. In FIG. 4, the duty cycle can be defined as the ratio of the durations 123 and 125 in which one of the valves is open, divided by the two durations 127 in which both valves are closed. As illustrated with reference to FIG. 3 above, certain properties of the gas reservoir and the gas conduit may change during operation, and the duty cycles can be adjusted to achieve a constant flow of gas towards the processing location. In order to achieve such constant flow with two process gases in the example illustrated with reference to FIG. 4, it is possible to change the ratio of the sum of the two durations 123 and 125 divided by the sum of the two durations 127. For example, the first duration 127 between duration 123 and duration 125 can be maintained constant, while the second duration 127 between the duration 125 and the end of the cycle 129 is changed. If the sum of the durations 127 is increased while the durations 123 and 125 are maintained equal, the ratio of the sum of the two durations 123 and 125 divided by the sum of the two durations 127 becomes smaller and the gas flow towards the processing location is reduced.

This example shows that the gas flow towards the processing location and the gas pressure within the vacuum volume 53 can be adjusted by changing the duty cycle also when two or more process gases are used. In addition, the pressure signal generated by the vacuum sensor 53 can be used as illustrated with reference to FIG. 3 above in order to change the duty cycle based on the pressure value.

While FIG. 4 illustrates the alternating control of only two valves, the same principles of avoiding gas mixtures already in the manifold or the pipe can be applied to three or more valves, wherein periods are provided in which only one valve is open and the remaining valves are closed, wherein these periods can be separated by additional time periods in which all valves are closed.

A common heater for the gas conduits $65_1$, $65_2$, $65_3$ and valves $67_1$, $67_2$, $67_3$ is indicated by a rectangle 141 in FIG. 2. The common heater can be implemented, for example, by a common carrier to which the gas conduits and valves are thermally connected and wherein electric energy can be supplied from the controller 71 to the common carrier via terminals 143 in order to commonly heat the gas conduits and valves. The heating of the gas conduits and valves is provided for avoiding depositions of process gases within the gas conduits and valves. It is also possible to thermally connect the manifold 85 and a portion of the pipe 69 with the common heater 141 such that a deposition of process gases is also avoided or reduced within the manifold 85 and pipe 69. It can be advantageous to control the common heater such that the temperature of the gas conduits and valves is greater than the highest temperature within the reservoirs and lower than the lowest dissociation temperature of the process gases used.

In a particular example, the reservoir $63_1$ provides fluorine as the process gas, while one or both of the remaining reservoirs $63_2$, $63_3$ provide a process gas which is different from fluorine. For example, these other process gases may contain Pt, W, $SiO_2$, Au, J, C, $O_2$, $N_2$ and $H_2O$. Conventionally, a reservoir containing fluorine as a process gas is typically cooled, and also gas conduits supplying fluorine to a gas valve are conventionally cooled, or at least not heated. However, in the present example, the gas conduit $65_1$ supplying the process gas fluorine to the valve $67_1$ is commonly heated together with the other gas conduits and valves. In this respect, the inventors have found that it is advantageous to actively cool the gas reservoir providing fluorine, since fluorine is stored in a solid state within the reservoir and is generated by sublimation from the solid state. However, fluorine is in its gaseous state within the gas conduit $65_1$ downstream of the block valve $76_1$ such that a warming of the process gas within the gas conduit $65_1$ has no disadvantage.

Moreover, an active cooling of the reservoir of fluorine or other process gases which are conventionally cooled in their reservoirs is not necessary since the control of the gas flow can be achieved by changing the duty cycle. Passive cooling of the reservoir storing fluorine using water or circulation of air can be sufficient. In particular, such passive cooling does not require controlling.

Some examples of process gases used in practice are provided below:

Methylcyclopentadienyl(trimethyl)platin(IV) having a dissociation temperature of about 90° Celsius can be stored in a reservoir at temperatures from about 50° Celsius to about 80° Celsius and used for depositing Platinum (Pt).

Tungstenhexacarbonyl W(CO)6 having a dissociation temperature of about 196° Celsius can be stored in a reservoir at temperatures from about 60° Celsius to about 80° Celsius and used for depositing Tungsten (W).

Phenantrene $C_{14}H_{10}$ $C_9H_{16}Pt$ having a dissociation temperature of about 89° Celsius to 100° Celsius can be stored in a reservoir at temperatures from about 60° Celsius to about 85° Celsius and used for depositing Carbon (C).

Dimethyl(acetylacetonat)gold(III) $(CH_3)_2(C_5H_7O_2)Au$ (III) having a dissociation temperature of about 80° Celsius to 82° Celsius can be stored in a reservoir at temperatures from about 50° Celsius to about 75° Celsius and used for depositing Gold (Au).

2,4,6,8,10-Pentamethylcyclopentasiloxane (PMCPS) having a dissociation temperature of more than 120° Celsius can be stored in a reservoir at temperatures from about 20° Celsius to about 50° Celsius and used for depositing insulators $SiO_X$.

Diacetoxy-di-tert-butoxysilane $C_{12}H_{24}O_6Si$ (BDAC or DTBS) having a dissociation temperature of more than 120° Celsius can be stored in a reservoir at temperatures from about 20° Celsius to about 50° Celsius and used for depositing an insulator $SiO_2$.

Xenondifluorid ($XeF_2$) having a dissociation temperature of about 180° Celsius can be stored in a reservoir at temperatures from about 1° Celsius to about 35° Celsius and used for transporting fluorine (F) to the processing location.

Magnesiumsulfateheptahydrat ($MgSO_4 \times 7H_2O$) having a dissociation temperature of about 150° Celsius can be stored in a reservoir at temperatures from about 20° Celsius to about 35° Celsius and used for transporting water ($H_2O$) to the processing location.

Oxygen ($O_2$) having a dissociation temperature of more than 120° Celsius can be stored in a reservoir at temperatures from about 20° Celsius to about 100° Celsius and used for transporting Oxygen ($O_2$) to the processing location.

Nitrogen ($N_2$) having a dissociation temperature of more than 120° Celsius can be stored in a reservoir at temperatures from about 20° Celsius to about 100° Celsius and used for transporting Nitrogen ($N_2$) to the processing location.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A gas supply system configured to supply a process gas to a processing location of a charged particle beam system, the gas supply system comprising:
   a gas reservoir;
   a gas conduit having a first end connected to the gas reservoir;
   a pipe having a first end located close to the processing location;
   a valve provided between a second end of the gas conduit and a second end of the pipe, the valve being configured to selectively allow and prevent a gas flow from the gas reservoir to the processing location via the gas conduit and the pipe; and
   a controller configured to open the valve and to close the valve to switch the gas supply system between a first mode and a second mode,
   wherein:
      in the first mode, process gas is not supplied to the processing location;
      in the second mode, process gas is supplied to the processing location;
      the controller is configured to alternately open and close the valve in plural cycles at a beginning of the second mode;
      each cycle includes a first duration in which the valve is open and a second duration immediately subsequent to the first duration in which the valve is closed; and
      the following relation is fulfilled for at least one pair of cycles:
         a ratio of the first duration to the second duration is less in a first cycle than a ratio of the first duration to the second duration in a second cycle which is after the first cycle.

2. The gas supply system of claim 1, wherein the controller is configured so that relation is fulfilled for more than five pairs of cycles.

3. The gas supply system of claim 1 wherein the controller is configured so that the relation is fulfilled for more than two pairs of immediately successive cycles.

4. The gas supply system of claim 1, wherein the controller is configured so that the first mode of operation has a duration of more than one second.

5. The gas supply system of claim 1, wherein the controller is configured so that the second mode of operation has a duration of more than 0.1 second.

6. A gas supply system configured to supply a process gas to a processing location of a charged particle beam system, the gas supply system comprising:
   a pipe having a first end located close to the processing location;
   a first gas reservoir;
   a first gas conduit having a first end connected to the first gas reservoir;
   a first valve provided between a second end of the first gas conduit and a second end of the pipe, the first valve being configured to selectively allow and prevent a gas flow from the first gas reservoir to the processing location via the first gas conduit and the pipe;
   a second gas reservoir;
   a second gas conduit having a first end connected to the second gas reservoir;
   a second valve between a second end of the second gas conduit and a second end of the pipe, the second valve being configured to selectively allow and prevent a gas flow from the second gas reservoir to the processing location via the second gas conduit and the pipe; and
   a controller configured to alternately open and close the first and second valves in plural cycles,
   wherein:
      each cycle includes a first duration in which the first valve is open and the second valve is closed and a second duration in which the first valve is closed and the second valve is open; and
      the controller is configured to change a ratio of the first duration to the second duration to adjust a ratio between an amount of gas supplied from the first gas reservoir to the processing location and an amount of gas supplied from the second gas reservoir to the processing location.

7. The gas supply system of claim 6, wherein the controller is configured so that each cycle includes at least one third duration in which both the first and second valves are closed.

8. A system configured to supply a process gas to a processing location, the gas supply system comprising:
   a vacuum enclosure containing the processing location;
   a vacuum pump configured to evacuate the vacuum enclosure;
   a pressure sensor configured to generate a pressure signal indicative of a gas pressure within the vacuum enclosure;
   a gas reservoir;
   a gas conduit having a first end connected to the gas reservoir;
   a pipe having a first end located close to the processing location;
   a valve between a second end of the gas conduit and a second end of the pipe, the valve being configured to selectively allow and prevent a gas flow from the gas reservoir to the processing location via the gas conduit and the pipe; and
   a controller configured to open and to close the valve to switch the system from a first mode in which process gas is not supplied to the processing location to a second mode in which process gas is supplied to the processing location,
   wherein:
      the controller is configured to alternately open and close the valve in plural cycles in the second mode;
      each cycle includes a first duration in which the valve is open and a second duration immediately subsequent to the first duration in which the valve is closed; and
      the controller is configured to adjust a ratio between the first duration and the second duration based on the pressure signal.

9. The system of claim 8, wherein the controller is configured to adjust the ratio such that the pressure signal has a predetermined value.

10. The system of claim 9, wherein the system comprises plural gas reservoirs, plural gas conduits and plural valves, and wherein:
   the plural gas reservoirs contain different gases;
   the controller comprises a memory for plural predetermined values;
   each the plural valves is associated with a corresponding one of the plural predetermined values; and
   the controller is configured to open and to close, in the second mode, a selected one of the plural valves and to adjust the ratio such that the pressure signal has a value corresponding to the predetermined value associated with the selected valve.

11. A gas supply system configured to supply a process gas to a processing location of a charged particle beam system, the gas supply system comprising:
- a pipe having a first end located close to the processing location;
- a first gas reservoir;
- a first gas conduit having a first end connected to the first gas reservoir;
- a first valve between a second end of the first gas conduit and a second end of the pipe, the first valve being configured to selectively allow and prevent a gas flow from the first gas reservoir to the processing location via the first gas conduit and the pipe;
- a second gas reservoir;
- a second gas conduit having a first end connected to the second gas reservoir;
- a second valve between a second end of the second gas conduit and a second end of the pipe, the second valve being configured to selectively allow and prevent a gas flow from the second gas reservoir to the processing location via the second gas conduit and the pipe; and
- a heater configured to commonly heat the first and second gas conduits;

wherein:
- the first gas reservoir is not actively cooled;
- the first gas reservoir contains a first gas;
- the first gas is selected from the group consisting of a fluorine gas and a chlorine gas;
- the second gas reservoir contains a second gas;
- the second gas is free of fluorine and chlorine; and
- the second gas comprises:
  - at least gas one gas selected from the group consisting of $SiO_2$, $O_2$, $N_2$ and $H_2O$; or
  - at least one composition comprising Pt, W, Au, J and C.

12. The system of claim 1, wherein the gas conduit has a length of more than 100 mm.

13. The system of claim 1, wherein the gas conduit has a volume of more than 100 $mm^3$.

14. The system of claim 1, wherein the valve comprises an actuator controlled by the controller.

15. The system of claim 1, wherein the charged particle beam system comprises a particle beam column configured to generate a particle beam directed to the processing location.

16. The system of claim 15, wherein the particle beam column comprises an electron beam column configured to generate an electron beam directed to the processing location.

17. The system of claim 15, wherein the particle beam column comprises an ion beam column configured to generate an ion beam directed to the processing location.

18. The system of claim 1, wherein the charged particle beam system comprises an electron beam column configured to generate an electron beam directed to the processing location, and the charged particle beam system comprises ion beam column configured to generate an ion beam directed to the processing location.

19. The system of claim 1, wherein the pipe, the valve, and at least a portion of the gas conduit are commonly contained within a vacuum enclosure.

20. The system of claim 19, wherein the gas reservoir is contained within the vacuum enclosure.

21. The system of claim 19, wherein the reservoir is located outside of the vacuum enclosure, and the gas conduit traverses a wall of the vacuum enclosure.

22. The system of claim 19, wherein a distance between the valve and the processing location is less than 100 mm.

* * * * *

UNITED STATES PATENT AND TRADEMARK OFFICE

CERTIFICATE OF CORRECTION

| | | |
|---|---|---|
| PATENT NO. | : 8,969,835 B2 | Page 1 of 1 |
| APPLICATION NO. | : 13/746560 | |
| DATED | : March 3, 2015 | |
| INVENTOR(S) | : Ulrike Zeile and Matthias Knappich | |

It is certified that error appears in the above-identified patent and that said Letters Patent is hereby corrected as shown below:

In the Specification

Col. 12, line 26, delete "Phenantrene" and insert -- Phenanthrene --.

Col. 12, line 30, delete "(acetylacetonat)" and insert -- (acetylacetonate) --.

In the Claims

Col. 13, line 38, Claim 2, before "relation", insert -- the --.

Signed and Sealed this
Eighteenth Day of August, 2015

Michelle K. Lee
*Director of the United States Patent and Trademark Office*